United States Patent
Ravezzi et al.

(10) Patent No.: US 8,384,421 B1
(45) Date of Patent: Feb. 26, 2013

(54) DIGITAL CMOS CIRCUIT WITH NOISE CANCELLATION

(75) Inventors: Luca Ravezzi, San Francisco, CA (US); Hamid Partovi, Los Altos, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 13/092,084

(22) Filed: Apr. 21, 2011

(51) Int. Cl.
*H03K 17/16* (2006.01)

(52) U.S. Cl. .......................... 326/26; 326/27

(58) Field of Classification Search .............. 326/21–34, 326/82–87; 327/108, 109
See application file for complete search history.

(56) References Cited

U.S. PATENT DOCUMENTS

| | | | |
|---|---|---|---|
| 4,857,770 A | 8/1989 | Partovi et al. | |
| 5,073,727 A | 12/1991 | Shizu | |
| 6,407,608 B1 | 6/2002 | Brown et al. | |
| 6,691,923 B2* | 2/2004 | Shearer | 236/78 R |
| 6,744,273 B2 | 6/2004 | Kitagawa et al. | |
| 7,492,189 B2* | 2/2009 | Park | 326/82 |
| 7,579,905 B2 | 8/2009 | Wu | |
| 7,768,433 B2* | 8/2010 | Mathe et al. | 341/143 |
| 2003/0085765 A1* | 5/2003 | Mullgrav, Jr. | 330/297 |
| 2005/0180528 A1* | 8/2005 | Manku | 375/316 |
| 2005/0206427 A1* | 9/2005 | Yuasa et al. | 327/262 |
| 2006/0061414 A1* | 3/2006 | North | 327/551 |
| 2007/0096783 A1 | 5/2007 | de la Torre | |
| 2007/0222517 A1* | 9/2007 | Wu et al. | 330/258 |
| 2008/0218254 A1 | 9/2008 | Wu | |
| 2009/0267640 A1* | 10/2009 | Kuzmenka | 326/30 |
| 2010/0056094 A1* | 3/2010 | Yang | 455/323 |
| 2011/0193635 A1* | 8/2011 | Zeng et al. | 330/296 |
| 2011/0285432 A1* | 11/2011 | Ozawa | 327/149 |

OTHER PUBLICATIONS

Guerber, Jon; "Design and Analysis of a Self Biased Flicker Noise Cancelling CMOS Direct Conversion Mixer"; ECE 621; Winter 2010.
Chen, Wei-Hung, et al., "A Highly Linear Broadband CMOS LNA Employing Noise . . . Cancellation"; IEEE Journal of Solid State Circuits; vol. 43—No. 5; May 2008.

* cited by examiner

*Primary Examiner* — Thienvu Tran

(57) ABSTRACT

A system is provided with a digital complementary-metal-oxide-semiconductor (CMOS) device and a noise cancellation circuit. The CMOS device has a first interface to accept a binary logic input signal, a second interface to accept a source current, a third interface to supply a binary logic output signal, and a fourth interface connected to a first dc voltage (e.g., ground) to sink current. A first resistor is interposed between a second dc voltage (e.g., Vdd), with a potential higher than the first dc voltage, and the second interface of the CMOS device. The noise cancellation circuit has a first interface connected to the second dc voltage. The noise cancellation circuit high pass filters ac noise on the second dc voltage, amplifies the filtered noise, and supplies the amplified noise at a second interface connected to the second interface of the CMOS device.

15 Claims, 7 Drawing Sheets

DIGITAL CMOS CIRCUIT WITH NOISE CANCELLATION

BACKGROUND OF THE INVENTION

1. Field of the Invention

This invention generally relates to complementary-metal-oxide-semiconductor (CMOS) circuitry and, more particularly, to a noise cancellation circuit to protect digital CMOS circuitry from high frequency noise on the power supply.

2. Description of the Related Art

Digital circuitry typically operates in conjunction with high-speed clock signals sourced from a crystal oscillator or phase-locked loop (PLL). Digital circuitry and the related clock distribution circuits normally use the same power supply. As a result, harmonic components over a wide range of frequencies of both the clock and the processed data signals can appear as noise on the power supply lines. Today's microprocessors work in the gigahertz frequency range, and such frequencies impose tight requirements in terms of clock skew and clock jitter to the microprocessor clock distribution, and the sensitivity of support circuitry to clock-related noise.

Simple passive low-pass filtering, e.g., a series resistor and shunt capacitor, is usually the only technique still employed by designers to cope with clock jitter generated by supply noise. The values of the resistor and capacitor can be tuned to optimize the filter response, and inductors can be added to attenuate particular frequencies. However, this approach is very expensive since significant active portions of an integrated circuit (IC) chip must be dedicated to the decoupling capacitors.

It would be advantageous if high-frequency noise on a power supply could be cancelled using an active circuit with a size factor that is less than a filtering capacitor.

SUMMARY OF THE INVENTION

Accordingly, a system is provided with a digital complementary-metal-oxide-semiconductor (CMOS) device and a noise cancellation circuit. The CMOS device has a first interface to accept a binary logic input signal, a second interface to accept a source current, a third interface to supply a binary logic output signal, and a fourth interface connected to a first dc voltage (e.g., ground) to sink current. Conventional buffers or inverters are examples of CMOS devices that process digital signals. A first resistor is interposed between a second dc voltage (e.g., Vdd), with a potential higher than the first dc voltage, and the second interface of the CMOS device. The noise cancellation circuit has a first interface connected to the second dc voltage. The noise cancellation circuit high pass filters ac noise on the second dc voltage, amplifies the filtered noise, and supplies the amplified noise at a second interface connected to the second interface of the CMOS device. The first resistor supplies the source current with the ac noise, while the noise cancellation circuit supplies the amplified noise opposite in phase to the ac noise.

In one aspect, the noise cancellation circuit includes a first field effect transistor (FET) having a source connected to the first dc voltage, a drain connected to the second interface of the CMOS device, and a gate. A first capacitor has a first terminal connected to the second dc voltage and a second terminal connected to the first FET gate. A second resistor has a first terminal connected to the second dc voltage and a second terminal connected to the first FET gate. A third resistor has a first terminal connected the first FET gate and a second terminal connected to the first dc voltage.

Additional details of the above-described system and a method for canceling power supply noise in a CMOS device are provided below.

DETAILED DESCRIPTION

Figure 1:
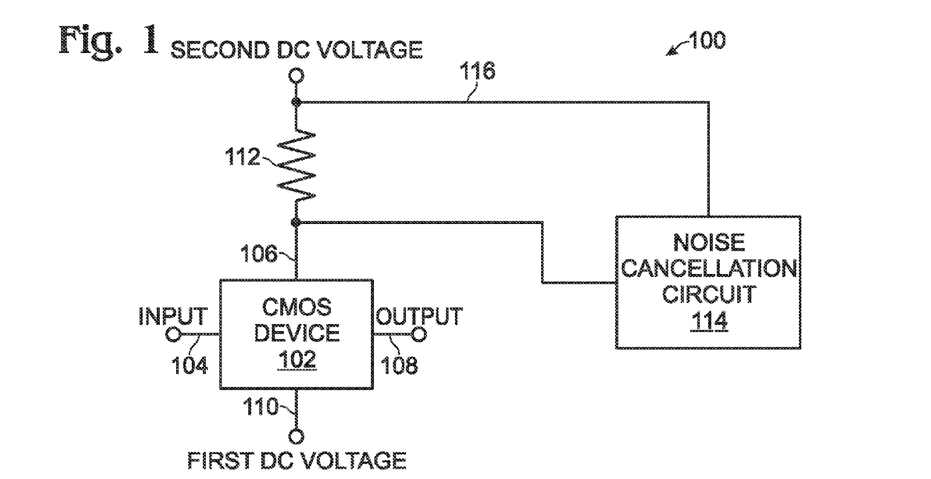
FIG. 1 is a schematic diagram of a system with a digital complementary-metal-oxide-semiconductor (CMOS) device and a noise cancellation circuit.

FIG. 1 is a schematic diagram of a system with a digital complementary-metal-oxide-semiconductor (CMOS) device and a noise cancellation circuit. The system 100 comprises a CMOS device 102 having a first interface on line 104 to accept a binary logic input signal, a second interface on line 106 to accept a source current, a third interface on line 108 to supply a binary logic output signal, and a fourth interface connected to a first dc voltage on line 110 to sink current. Some examples of a CMOS device includes an inverter or buffer. Alternatively stated, the CMOS device 102 can be any digital circuit that employees CMOS transistors. A first resistor (R1) 112 is interposed between a second dc voltage, with a potential higher than the first dc voltage, and the second interface of the CMOS device on line 106.

A noise cancellation circuit 114 has a first interface connected to the second dc voltage on line 116. The noise cancellation circuit 114 high pass filters ac noise on the second dc voltage, amplifies the filtered noise, and supplies the amplified noise at a second interface connected to the second interface of the CMOS device on line 106. The first resistor 112 supplies the source current on line 106 with the ac noise, while the noise cancellation circuit 114 supplies amplified noise on line 106 that is opposite in phase to the ac noise passing through the first resistor 112. Typically, the noise cancellation circuit second interface on line 106 supplies the amplified noise as an amplified noise current.

Figure 2:
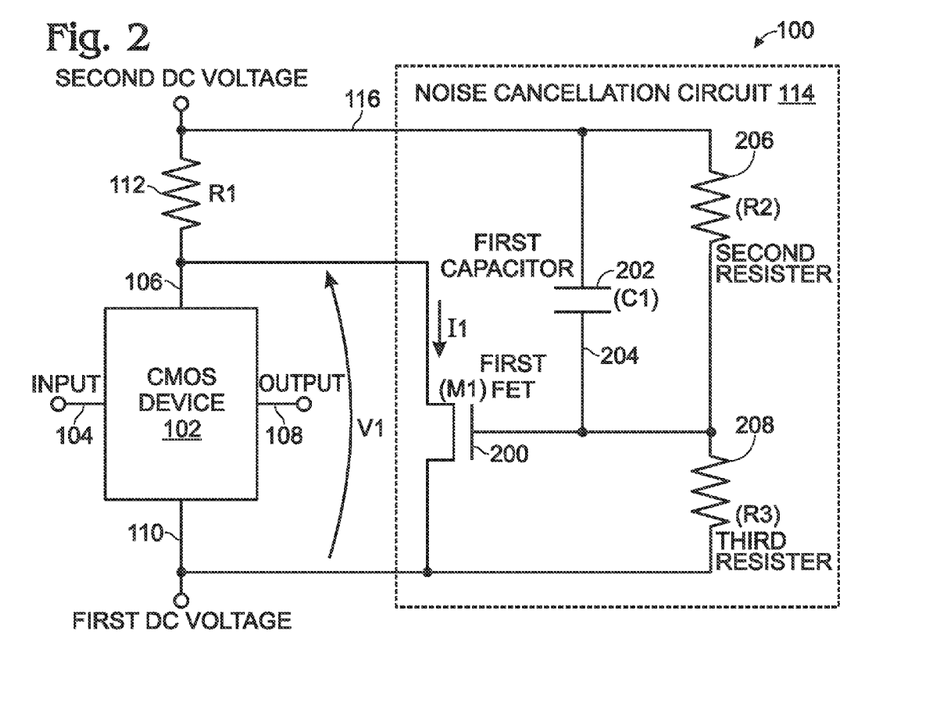
FIG. 2 is a schematic diagram depicting a first detailed variation of the noise cancellation circuit of FIG. 1.

FIG. 2 is a schematic diagram depicting a first detailed variation of the noise cancellation circuit of FIG. 1. In this aspect, the noise cancellation circuit 114 includes a first field effect transistor (FET) 200 (M1) having a source connected to the first dc voltage on line 110, a drain connected to the second interface of the CMOS device on line 106, and a gate. A first capacitor 202 (C1) has a first terminal connected to the second dc voltage on line 116 and a second terminal connected to the first FET gate on line 204. A second resistor 206 (R2) has a first terminal connected to the second dc voltage on line 116 and a second terminal connected to the first FET gate on line 204. A third resistor 208 (R3) has a first terminal connected the first FET gate on line 204 and a second terminal connected to the first dc voltage on line 110.

Figure 3:
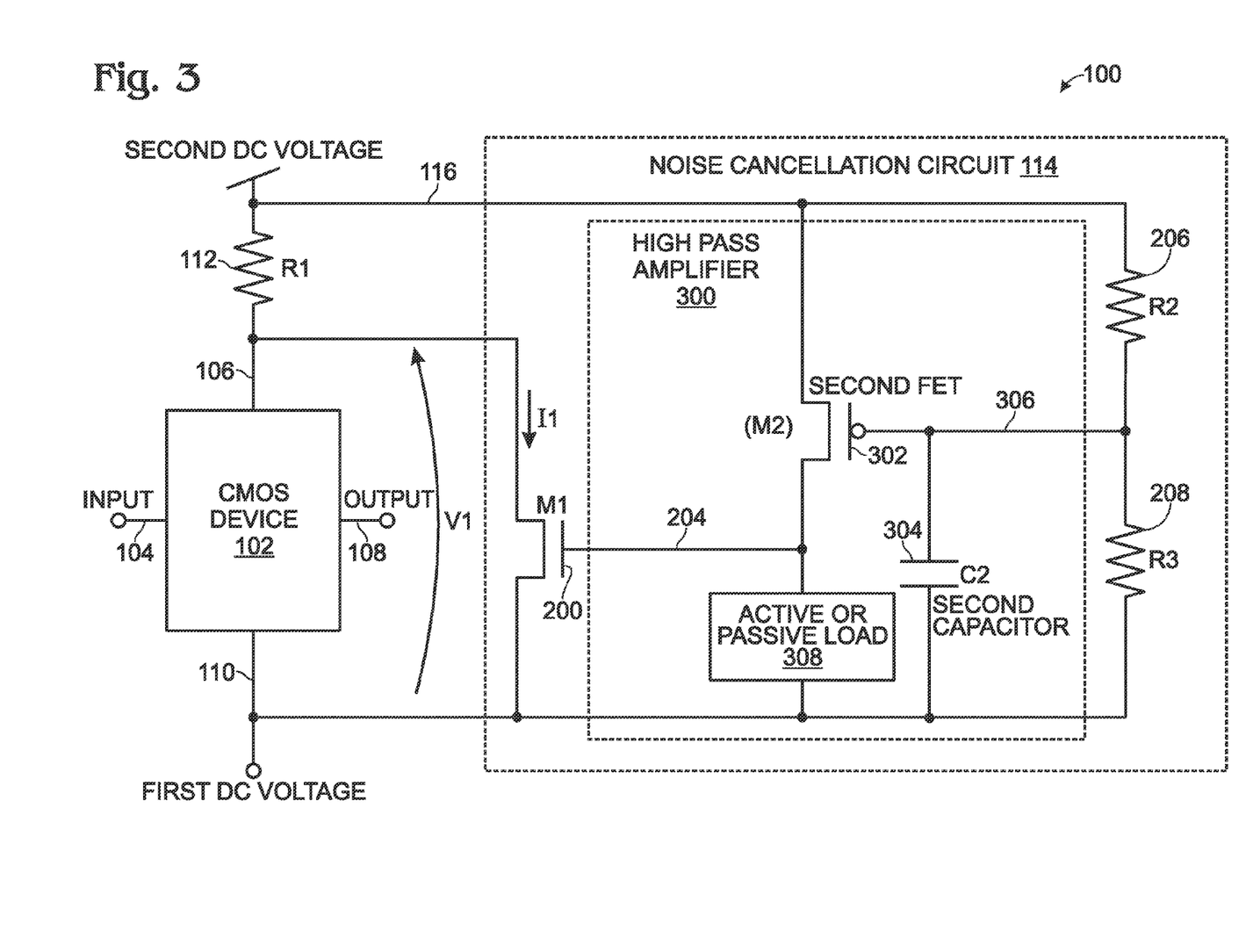
FIG. 3 is a schematic diagram depicting a second detailed variation of the noise cancellation circuit of FIG. 1.

FIG. 3 is a schematic diagram depicting a second detailed variation of the noise cancellation circuit of FIG. 1. The circuit of FIG. 3 is similar to the one of FIG. 2, except that a high pass amplifier 300 has been added. The noise cancellation circuit 114 includes the first FET 200 having the source connected to the first dc voltage on line 110, a drain connected to the second interface of the CMOS device on line 106, and a gate. A second FET 302 (M2) has a drain connected to the second dc voltage on line 116, a source connected to the gate of the first FET on line 204, and a gate. A second capacitor 304 (C2) has a first terminal connected to the first dc voltage on line 110 and a second terminal connected to the second FET gate on line 306. The second resistor 206 has a first terminal connected to the second dc voltage on line 116 and a second terminal connected to the second FET gate on line 306. The third resistor 208 has a first terminal connected the second FET gate on line 306 and a second terminal connected to the first dc voltage on line 110. A load 308 is interposed between the source of the second FET 302 and the first dc voltage on line 110.

The load 308 can be either a passive and active load. A simple passive load could be a resistor. Alternatively, the passive load may be frequency tuned with capacitors or inductors.

Figure 4:
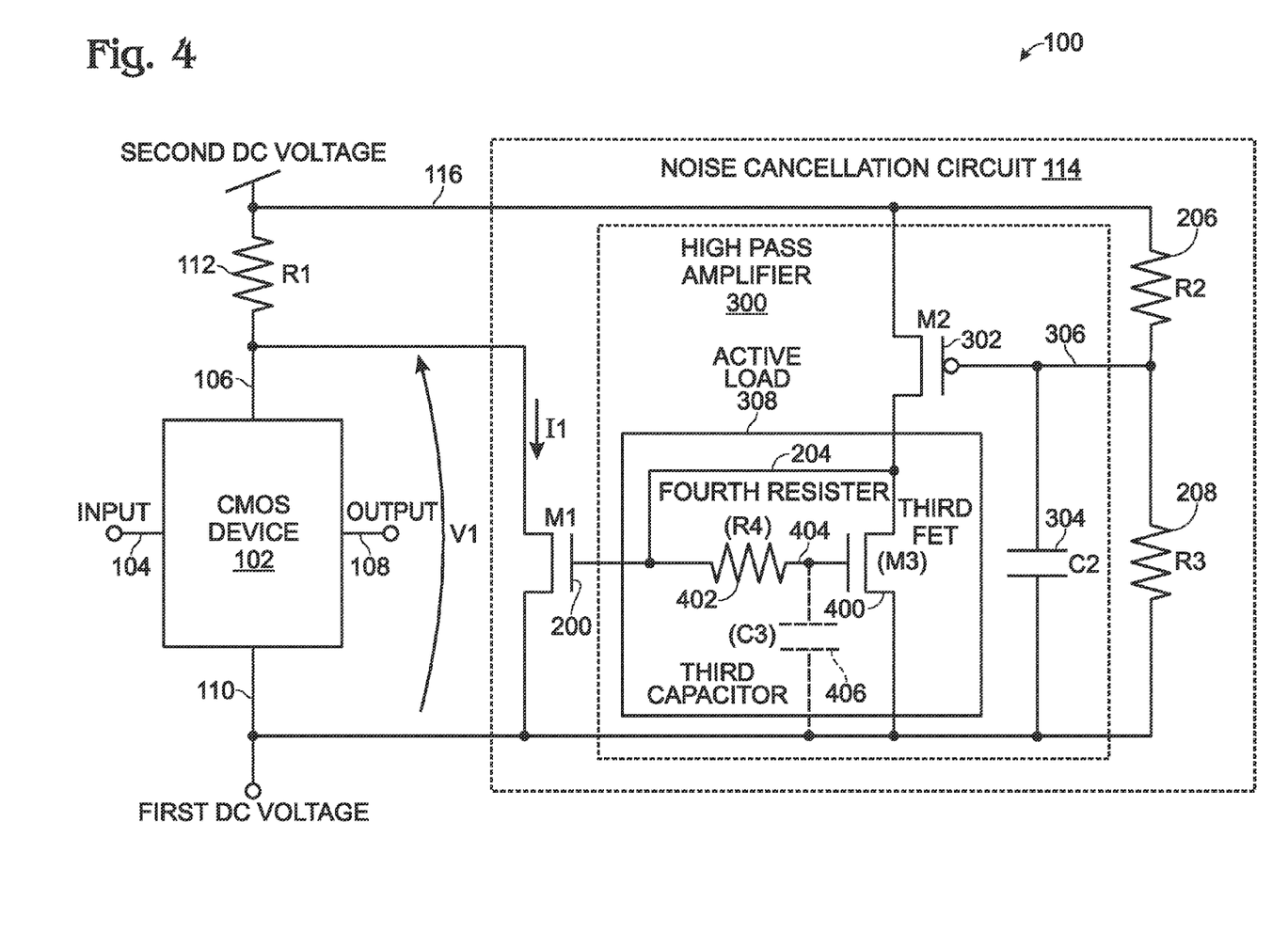
FIG. 4 is a schematic drawing of the system of FIG. 3 with an active load.

FIG. 4 is a schematic drawing of the system of FIG. 3 with an active load. In one aspect, the active load 308 includes a third FET 400 (M3) having a drain connected to the source of the second FET on line 204, a gate, and a source connected to the first dc voltage on line 110. A fourth resistor 402 has a first terminal connected to the gate of the third FET on line 404 and a second terminal connected to the source of the second FET on line 204. Optionally, the active load 308 may further include a third capacitor 406 (C3) having a first terminal connected to the gate of the third FET on line 404 and a second terminal connected to the first dc voltage on line 110. It should be understood that a practitioner skilled in the art would be able to design variations of the high pass amplifier and active loads, and that the noise cancellation circuit could be enabled using these alternative designs.

Figure 5:
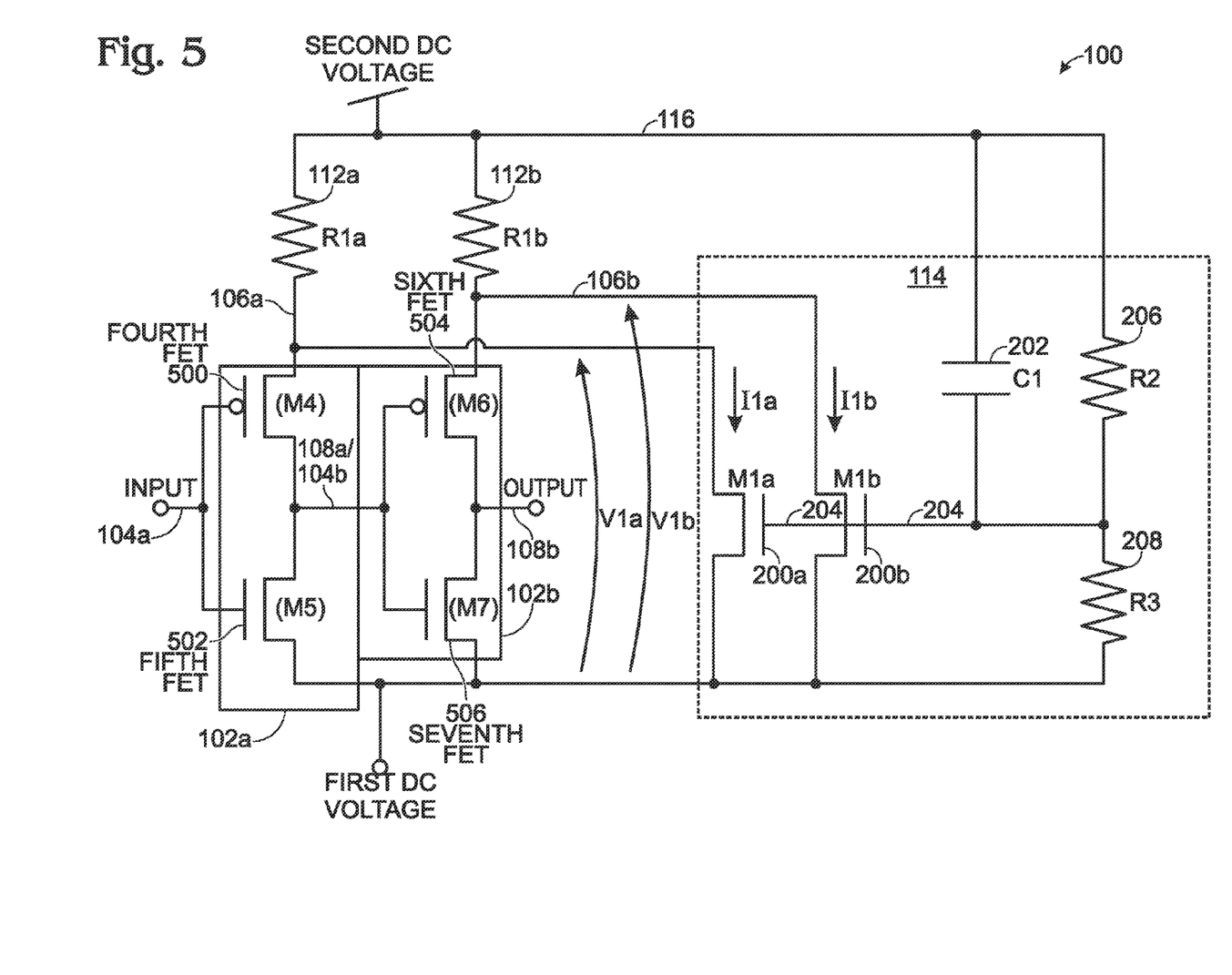
FIG. 5 is a schematic diagram depicting a variation of the system of FIG. 2.

FIG. 5 is a schematic diagram depicting a variation of the system of FIG. 2. This aspect of the system 100 comprises a first plurality of CMOS devices. Each CMOS device 102 has a first interface to accept the binary logic input signal on line 104, a second interface to accept a source current on line 106, a third interface to supply the binary logic output signal, and a fourth interface on line 110 connected to a first dc voltage to sink current. Shown are CMOS devices 102a and 102b. However, it should be understood that the system is not limited to any particular number of CMOS devices. CMOS device 102a is shown as comprised of a fourth FET 500 (M4) and a fifth FET 502 (M5). The output of CMOS device 102a on line 108a is the input to CMOS device 102b (line 104b). CMOS device 102b includes sixth FET 504 (M6) and seventh FET 506 (M7).

A first plurality of resistors, 112a and 112b, are interposed between the second dc voltage and the second interface 106 of each CMOS device 102. Likewise, the noise cancellation circuit 114 includes a first plurality of FETs, each having a source connected to the first dc voltage on line 110, a drain connected to the second interface of a corresponding CMOS device on line 106, and a gate connected to second terminal of the first capacitor on line 204. Shown are FETs 200a (M1a) and 200b (M1b), which correspond to CMOS devices 102a and 102b, respectively.

Figure 6:
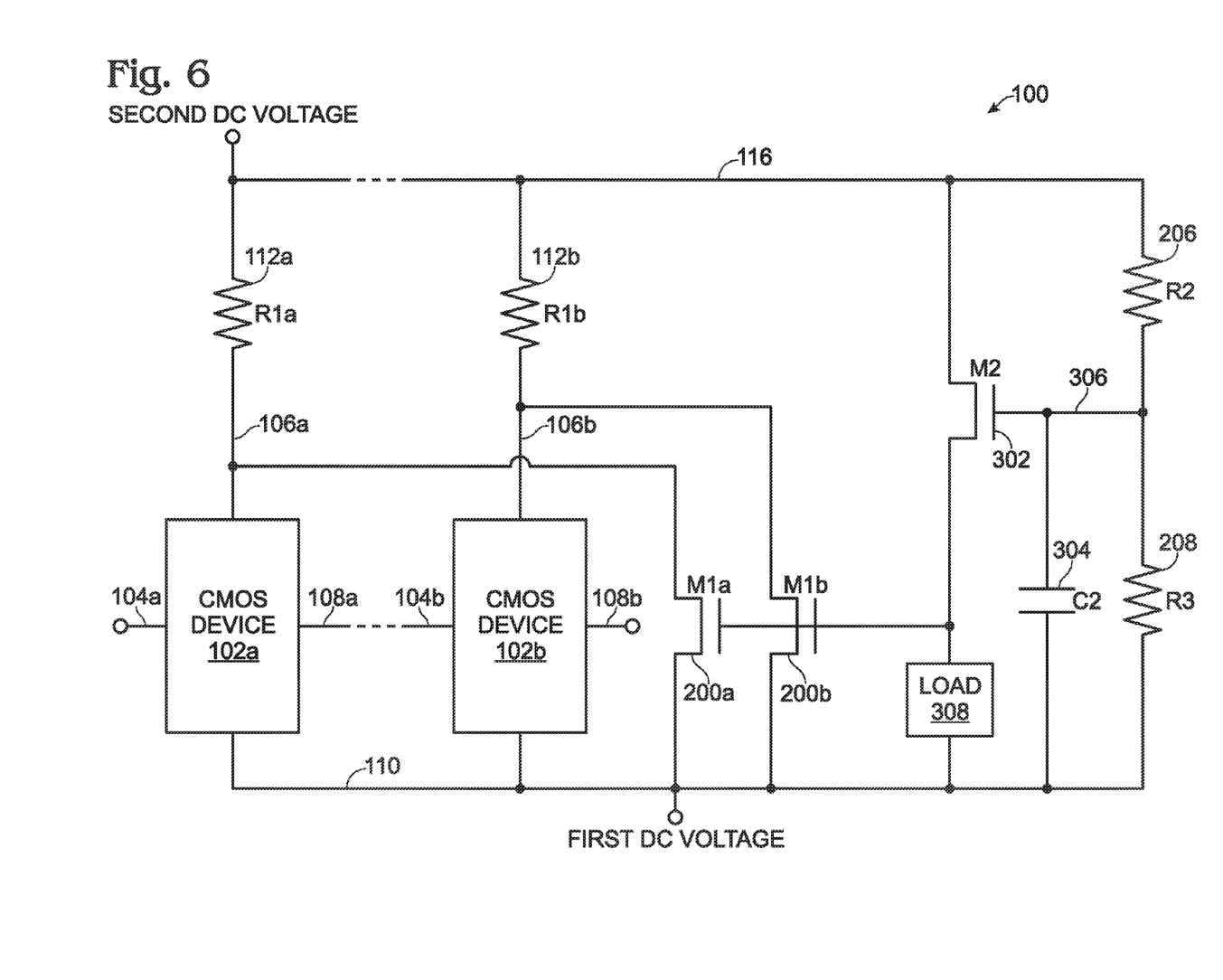
FIG. 6 is a schematic diagram depicting a variation of the system of FIG. 3.

FIG. 6 is a schematic diagram depicting a variation of the system of FIG. 3. Shown are a first plurality of CMOS devices, 102a and 102b. Again, the system 100 is not limited to any particular number of CMOS devices. Each CMOS device 102 has a first interface to accept a binary logic input signal on line 104, a second interface to accept a source current on line 106, a third interface to supply the binary logic output signal on line 108, and a fourth interface connected to a first dc voltage on line 110, to sink current.

A first plurality of resistors, 112a and 112b, are interposed between the second dc voltage and the second interface of each CMOS device 102. The noise cancellation circuit 114 includes a first plurality of first FETs 200a and 200b. Each first FET 200 has a source connected to the first dc voltage on line 110, a drain connected to the second interface of a corresponding CMOS device on line 106, and a gate connected to the source of the second FET on line 204.

Figure 7:
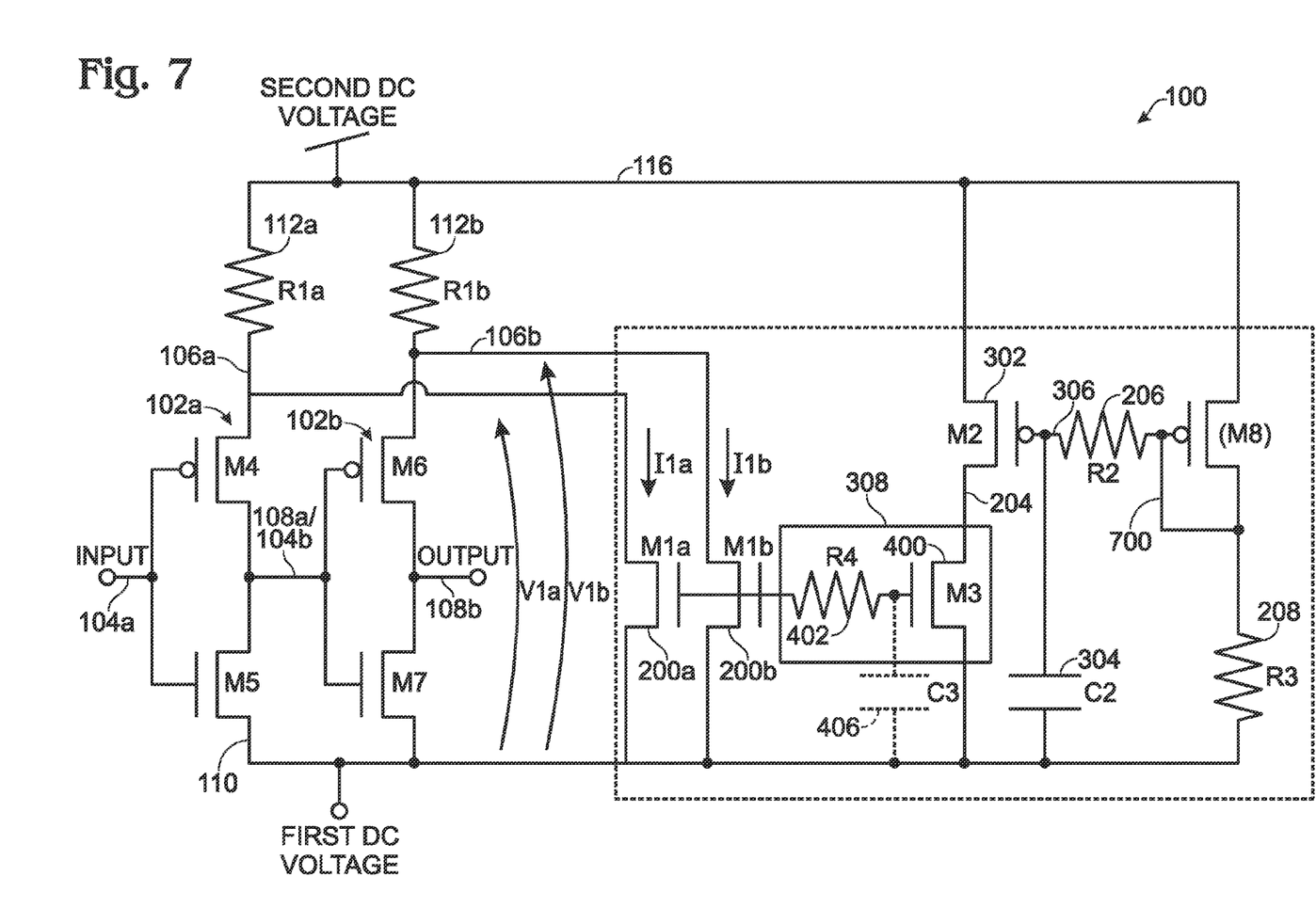
FIG. 7 is a schematic diagram depicting a variation of the system of FIG. 4.

FIG. 7 is a schematic diagram depicting a variation of the system of FIG. 4. Shown are a first plurality of CMOS devices, 102a and 102b. Again, the system 100 is not limited to any particular number of CMOS devices. Each CMOS device 102 has a first interface to accept a binary logic input signal on line 104, a second interface to accept a source current on line 106, a third interface to supply the binary logic output signal on line 108, and a fourth interface connected to a first dc voltage on line 110, to sink current.

A first plurality of resistors, 112a and 112b, are interposed between the second dc voltage and the second interface of each CMOS device 102. The noise cancellation circuit 114 includes a first plurality of first FETs 200a and 200b. Each first FET 200 has a source connected to the first dc voltage on line 110, a drain connected to the second interface of a corresponding CMOS device on line 106, and a gate connected to the source of the second FET on line 204. The noise cancellation circuit includes the second FET 302 having a drain connected to the second dc voltage, a source connected to the gate of each first FET on line 204, and a gate. The second capacitor 304 has a first terminal connected to the first dc voltage on line 110 and a second terminal connected to the second FET gate on line 306. The second resistor 206 has a first terminal and a second terminal connected to the second FET gate on line 306. The third resistor 208 has a first terminal connected the first terminal of the second resistor on line 700 and a second terminal connected to the first dc voltage on line 110.

The load 308 is interposed between the source of the second FET on line 204 and the first dc voltage on line 110. The load 308 is shown as active, but alternatively, it could be a passive load. An eighth FET 702 has a drain connected to the second dc voltage on line 116, a gate connected to the first terminal of the second resistor on line 700, and a source connected to the first terminal of the second resistor on line 700.

Functional Description

A CMOS buffer, made out of two basic inverters and with noise applied to their supply rails, responds with an output signal that is typically affected by jitter. In digital systems only the clock period jitter is usually of concern. Clock period jitter is defined as the error between the ideal clock period and the time interval separating two consecutive rising edges of the actual clock:

$$J_P = T_{CLK} - (t_{n+1} - t_n)$$

Where $t_n$ is the time of the n-th clock edge and $T_{CLK}$ is the ideal clock period.

The differential nature of the period jitter (i.e. the fact that it is sensitive to the difference between consecutive clock edges only) makes it a high-pass function of the noise frequency. As a result, a circuit that aims to reduce the period jitter due to supply noise can be designed by sensing it via a high-pass amplifier, and applying the correcting signal to the CMOS buffer in such a way that the noise itself is cancelled out.

Returning to FIG. 5, transistors M4-M7 form a simple CMOS buffer comprising two inverters. Note: a large variety of inverter and buffer designs are known in the art (not shown) that would benefit from the employment of the noise cancellation circuit 114. The noise cancellation circuit 114 is a basic high-pass noise cancellation circuit. Transistors M1$a$ and M1$b$ are in common-source configuration with their gates virtually connected to the supply rail through capacitor C1 at high frequencies. The voltage noise on the supply rail is, therefore, sensed by these transistors and the voltage drops on resistors R1$a$ and R1$b$ are adjusted by means of currents I1 and I2. Resistors R2 and R3 provide proper biasing for transistors M1$a$ and M1$b$.

The resulting voltage variation at the regulated supply rails V1 and V2 is given by the following formula:

$$\Delta V_x = \Delta V_{DD} - \Delta V_{DD} \cdot gm_x \cdot R_x = \Delta V_{DD}(1 - gm_x \cdot R_x) \quad (1)$$

where the "x" can be either 1$a$ or 1$b$ in the drawing.
In order for the noise on the supply rail to be completely cancelled out from the regulated voltages V1$a$ and V1$b$:

$$gm_x \cdot R_x = 1 \quad (2)$$

Meeting condition (2) ensures that voltages V1$a$ and V1$b$ remain constant over time and the CMOS buffer output clock is jitter-free.

However, resistors R1$a$ and R1$b$ must typically be very small so that, while the output period jitter is proficiently reduced, the basic transient behavior of the clock buffer is not compromised. Therefore, in some instances, condition (2) cannot be met because the values of trans-conductance $gm_x$ for transistors M1$a$ and M1$b$ cannot be made high enough.

This issue can be solved by adding a gain stage between the sensed supply rail and M1$a$ and M1$b$ gates. In this case, condition (2) becomes:

$$A \cdot gm_x \cdot R_x = 1 \quad (3)$$

where A is the gain of the addition amplification stage.

It is worth noticing that, due to the high-pass nature of the noise cancellation circuit, the additional gain stage can also be high-pass. Therefore, the extra amplification can be achieved as shown in FIG. 7. Transistor M2 senses the high frequency noise on the supply rail as a voltage variation between its source and its gate, and is AC-connected to ground through capacitor C2. The active load formed by M3 and R4 exhibits a high frequency impedance approaching $rds_{M3}$ and hence the overall high frequency gain A is approximately given by:

$$A = gm_{m2} \cdot rds_{m3}$$

Finally, devices M8, R2, and R3 provide the proper biasing for transistor M2.

By properly sizing the gain stage and the cancellation circuit, condition (3) can be fulfilled for high frequency noise components on the supply rail, and the buffer output clock does not exhibit any period jitter.

As previously mentioned, resistors R1$a$ and R1$b$ must be small enough so as to not interfere with the normal switching dynamics of the CMOS inverters. R1$a$ and R1$b$ can be partially formed from the parasitic resistance of the supply rail, if it can be reliably estimated. This approach saves area and, at the same time, takes advantage of the inevitable parasitic resistances on the power rails, which is often one of the major causes of speed limitation in CMOS clock distribution.

Simulation Results

CMOS devices, enabled as a buffer, and a noise cancellation circuit were designed in 45 nanometer (nm) standard CMOS technology. Its performance was tested and compared to a standard CMOS buffer. Both circuits received a jitter-free 2.0 GHz CMOS clock and drove 2 pF capacitive load (a fairly common load for an average clock buffer in a microprocessor design).

Figure 8:
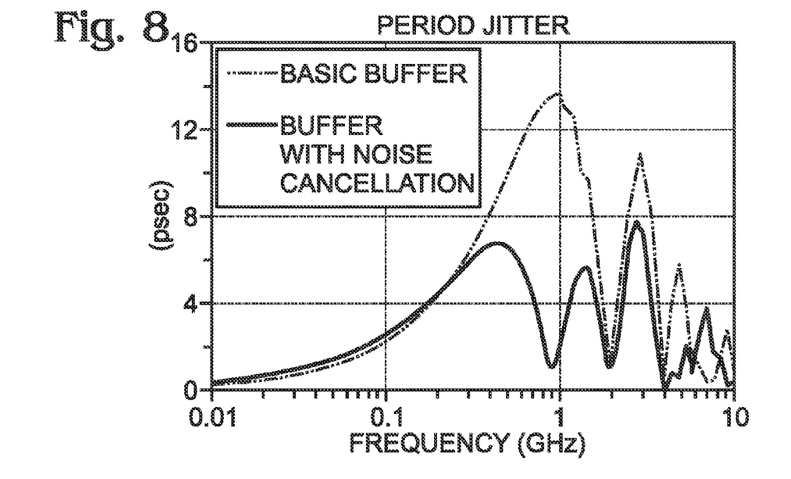
FIG. 8 is a graph depicting period jitter as a function of frequency.

FIG. 8 is a graph depicting period jitter as a function of frequency. The period jitter at the output of the standard CMOS buffer was compared to the system of FIG. 7 where sinusoidal noise at frequencies between 10 MHz and 10 GHz was applied on the supply rails. The noise cancellation system exhibited an overall period jitter about ½ of the standard buffer. The additional current required by the noise cancellation circuit is about 10% greater than the standard buffer consumption, whereas the additional required area is only about 6% greater.

Figure 9:
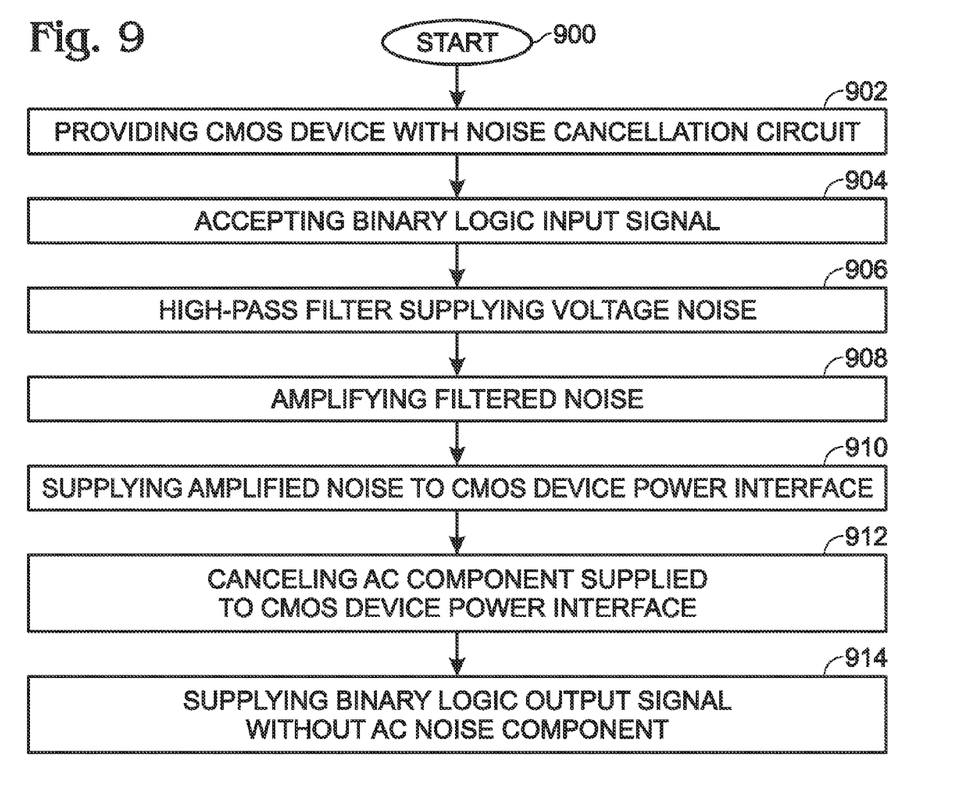
FIG. 9 is a flowchart illustrating a method for canceling power supply noise in a CMOS device.

FIG. 9 is a flowchart illustrating a method for canceling power supply noise in a CMOS device. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 900.

Step 902 provides a CMOS device having a power interface connected to receive a supply voltage with an ac noise component. Step 904 accepts a binary logic input signal to the CMOS device. Step 906 high pass filters noise on the supply voltage to create a filtered noise current. Step 908 amplifies the filtered noise current to create an amplified noise current. Step 910 supplies the amplified noise voltage to the CMOS device power interface. Step 912 cancels the ac noise component supplied to the CMOS device power interface with the amplified noise current. Step 914 supplies a binary logic output signal from the CMOS device, without the ac noise component.

A system and method have been provided for canceling high frequency noise in a digital CMOS device. Examples of particular components and circuit designs have been presented to illustrate the invention. However, the invention is not limited to merely these examples. Other variations and embodiments of the invention will occur to those skilled in the art.

The invention claimed is:

1. A system with a digital complementary-metal-oxide-semiconductor (CMOS) device and a noise cancellation circuit, the system comprising:
   a CMOS device having a first interface to accept a binary logic input signal, a second interface to accept a source current, a third interface to supply a binary logic output signal, and a fourth interface connected to a first dc voltage to sink current;
   a first resistor interposed between a second dc voltage, with a potential higher than the first dc voltage, and the second interface of the CMOS device; and,
   a noise cancellation circuit having a first interface connected to the second dc voltage, the noise cancellation circuit high pass filtering ac noise on the second dc voltage, amplifying the filtered noise, and supplying the amplified noise at a second interface connected to the second interface of the CMOS device.

2. The system of claim 1 wherein the noise cancellation circuit includes:
a first field effect transistor (FET) having a source connected to the first dc voltage, a drain connected to the second interface of the CMOS device, and a gate;
a first capacitor having a first terminal connected to the second dc voltage and a second terminal connected to the first FET gate;
a second resistor having a first terminal connected to the second dc voltage and a second terminal connected to the first FET gate; and,
a third resistor having a first terminal connected the first FET gate and a second terminal connected to the first dc voltage.

3. The system of claim 2 further comprising:
a first plurality of CMOS devices, each having a first interface to accept a binary logic input signal, a second interface to accept a source current, a third interface to supply the binary logic output signal, and a fourth interface connected to a first dc voltage to sink current;
a first plurality of resistors interposed between the second dc voltage and the second interface of each CMOS device; and,
wherein the noise cancellation circuit includes a first plurality of FETs, each having a source connected to the first dc voltage, a drain connected to the second interface of a corresponding CMOS device, and a gate connected to second terminal of the first capacitor.

4. The system of claim 1 wherein the noise cancellation circuit includes:
a first FET having a source connected to the first dc voltage, a drain connected to the second interface of the CMOS device, and a gate;
a second VET having a drain connected to the second dc voltage, a source connected to the gate of the first VET, and a gate;
a second capacitor having a first terminal connected to the first dc voltage and a second terminal connected to the second FET gate;
a second resistor having a first terminal connected to the second dc voltage and a second terminal connected to the second FET gate;
a third resistor having a first terminal connected the second FET gate and a second terminal connected to the first dc voltage; and,
a load interposed between the source of the second FET and the first dc voltage.

5. The system of claim 4 wherein the load is selected from a group consisting of a passive and active load.

6. The system of claim 5 wherein the active load includes:
a third FET having a drain connected to the source of the second VET, a gate, and a source connected to the first dc voltage; and,
a fourth resistor having a first terminal connected to the gate of the third FET and a second terminal connected to the source of the second FET.

7. The system of claim 6 wherein the active load further includes a third capacitor having a first terminal connected to the gate of the third FET and a second terminal connected to the first dc voltage.

8. The system of claim 4 further comprising:
a first plurality of CMOS devices, each having a first interface to accept a binary logic input signal, a second interface to accept a source current, a third interface to supply the binary logic output signal, and a fourth interface connected to a first dc voltage to sink current;
a first plurality of resistors interposed between the second dc voltage and the second interface of each CMOS device; and,
wherein the noise cancellation circuit includes a first plurality of first FETs, each first FET having a source connected to the first dc voltage, a drain connected to the second interface of a corresponding CMOS device, and a gate connected to the source of the second FET.

9. The system of claim 1 wherein the CMOS device is selected from a group consisting of an inverter and a buffer.

10. The system of claim 1 wherein the first resistor supplies the source current with the ac noise; and,
wherein the noise cancellation circuit supplies the amplified noise opposite in phase to the ac noise.

11. The system of claim 1 wherein the noise cancellation circuit second interface supplies the amplified noise as an amplified noise current.

12. The system of claim 1 further comprising:
a first plurality of CMOS devices, each having a first interface to accept a binary logic input signal, a second interface to accept a source current, a third interface to supply the binary logic output signal, and a fourth interface connected to a first dc voltage to sink current;
a first plurality of resistors interposed between the second dc voltage and the second interface of each CMOS device;
wherein the noise cancellation circuit includes a first plurality of first FETs, each first FET having a source connected to the first dc voltage, a drain connected to the second interface of a corresponding CMOS device, and a gate;
a second FET having a drain connected to the second dc voltage, a source connected to the gate of each first FET, and a gate;
a second capacitor having a first terminal connected to the first dc voltage and a second terminal connected to the second FET gate;
a second resistor having a first terminal and a second terminal connected to the second VET gate;
a third resistor having a first terminal connected the first terminal of the second resistor and a second terminal connected to the first dc voltage;
a load interposed between the source of the second FET and the first dc voltage; and,
a third FET having a drain connected to the second dc voltage, a gate connected to the first terminal of the second resistor, and a source connected to the first terminal of the second resistor.

13. A method for canceling power supply noise in a complementary-metal-oxide-semiconductor (CMOS) device, the method comprising:
providing a CMOS device having a power interface connected to receive a supply voltage with an ac noise component;
accepting a binary logic input signal to the CMOS device;
high pass filtering noise on the supply voltage to create a filtered noise current;
amplifying the filtered noise current to create an amplified noise current;
supplying the amplified noise voltage to the CMOS device power interface; and,
canceling the ac noise component supplied to the CMOS device power interface with the amplified noise current.

14. The method of claim 13 further comprising:

supplying a binary logic output signal from the CMOS device, without the ac noise component.

15. A method for canceling power supply noise in a complementary-metal-oxide-semiconductor (CMOS) device, the method comprising:

providing a CMOS device having a power interface connected to receive a supply voltage with an ac noise component;

accepting a binary logic input signal to the CMOS device;

a means for high pass filtering noise on the supply voltage to create a filtered noise current;

a means for amplifying the filtered noise current to create an amplified noise current;

a means for supplying the amplified noise voltage to the CMOS device power interface; and, a means for canceling the ac noise component supplied to the CMOS device power interface with the amplified noise current.

* * * * *